(12) United States Patent
Jiang et al.

(10) Patent No.: US 7,741,224 B2
(45) Date of Patent: Jun. 22, 2010

(54) PLASMA TREATMENT AND REPAIR PROCESSES FOR REDUCING SIDEWALL DAMAGE IN LOW-K DIELECTRICS

(75) Inventors: Ping Jiang, Plano, TX (US); Laura M. Matz, Macungie, PA (US); Rosa A. Orozco-Teran, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 300 days.

(21) Appl. No.: 11/776,130

(22) Filed: Jul. 11, 2007

(65) Prior Publication Data
US 2009/0017563 A1 Jan. 15, 2009

(51) Int. Cl.
*H01L 21/311* (2006.01)

(52) U.S. Cl. ............... 438/700; 257/759; 257/E21.579

(58) Field of Classification Search ................. 257/758, 257/759, E21.579, E21.585; 438/623, 637, 438/639, 700
See application file for complete search history.

(56) References Cited

U.S. PATENT DOCUMENTS

| 6,838,300 | B2 | 1/2005 | Jin et al. | |
|---|---|---|---|---|
| 7,135,402 | B2 * | 11/2006 | Lin et al. | 438/639 |
| 2006/0194447 | A1 | 8/2006 | Ruan et al. | |
| 2007/0077751 | A1 | 4/2007 | Chen et al. | |
| 2007/0224824 | A1 * | 9/2007 | Chen et al. | 438/700 |

* cited by examiner

*Primary Examiner*—David Vu
(74) *Attorney, Agent, or Firm*—Warren L. Franz; Wade J. Brady, III; Frederick J. Telecky, Jr.

(57) ABSTRACT

A method of forming an interconnect structure for an integrated circuit, including the steps of providing a substrate and forming a dielectric stack on the substrate including an etch-stop layer, a low-k dielectric layer, and a hardmask layer. The method further includes the steps of patterning a photoresist masking layer on the dielectric stack to define a plurality of feature defining regions and plasma processing the substrate in a plasma-based reactor, The processing step includes etching a plurality of features into the hardmask layer and at least a portion of the low-k dielectric layer and performing a plasma treatment process in situ in the plasma-based reactor, where the plasma treatment process includes flowing at least one hydrocarbon into the reactor and generating a plasma, where a mass flow rate of the hydrocarbon is at least 0.1 sccm. The method also includes forming a metal conductor in the plurality of features.

39 Claims, 4 Drawing Sheets

PLASMA TREATMENT AND REPAIR PROCESSES FOR REDUCING SIDEWALL DAMAGE IN LOW-K DIELECTRICS

FIELD OF THE INVENTION

The present invention relates to plasma processing for integrated circuits, resulting structures, and integrated circuits therefrom.

BACKGROUND OF THE INVENTION

Interconnect (RC) delay is known to be a major limiting factor in the drive to improve the speed and performance of integrated circuits (IC). For performance and cost reasons, it is desirable to have adjacent conductors as close as possible to one another. Since interconnect delay depends on both the dielectric constant of the insulating material that separates the conductors and the thickness of this insulating material, the interconnect delay can be reduced by using low dielectric constant (low-k) materials. Low-k dielectric materials refer to those insulating materials that have a dielectric constant (k) lower than that of silicon dioxide ($SiO_2$) (k=3.9) and generally having k≦3.

In recent years, low-k materials that have been developed to replace relatively high dielectric constant insulating materials, such as $SiO_2$, have been utilized in the fabrication of integrated circuits. Unless otherwise noted, all k-values mentioned in the present application are measured relative to a vacuum. In particular, low-k films are being utilized for inter-level and intra-level dielectric layers between metal layers of semiconductor devices. Additionally, in order to further reduce the dielectric constant of insulating materials, low-k dielectrics can be formed with pores, commonly referred to as porous low-k dielectric films. Porous low-k films which provide k<2.6 are generally referred to as ultra low-k (ULK) films.

Low-k dielectric films, including ULK films, can be deposited by spin-on dielectric (SOD) methods similar to the application of photoresist, by chemical vapor deposition (CVD) methods, or by plasma enhanced CVD (PECVD) methods. Thus, the use of low-k materials is readily adaptable to existing semiconductor manufacturing processes. Examples of typical low-k dielectric materials include fluorine-doped silicon dioxide (also referred to as fluorinated silicate glass, or FSG), organosilicate glass (OSG), thermoplastic organic polymers, aerogel, xerogel, and other conventional low-k insulator materials.

However, these low-k dielectric films also present many fabrication challenges. First, low-k dielectric films tend to be less robust than more traditional dielectric layers and can be damaged during certain wafer processing steps, such as by plasma etch and plasma ash processes generally used in patterning the dielectric layer, as well as from barrier/seed deposition processes and chemical-mechanical polishing (CMP). Further, some low-k films tend to be highly reactive when damaged, particularly after patterning, thereby allowing the low-k material to absorb water and/or react with other vapors and/or process contaminants that can alter the electrical properties of the dielectric layer. As a result, low-k dielectric films, originally having a low k-value, as applied, can suffer damage leading to an increase in its k-value and other detrimental effects.

For example, an important class of low-k dielectric materials is referred to as substitution-group depleted silicon oxide. By way of definition, these low-k materials have the chemical formula $R_1R_2SiO_x$, where $R_1$ and $R_2$ refer to hydrogen, oxygen, a methyl group (—$CH_3$), an ethyl group (—$CH_2$—$CH_3$), a phenyl, or a dangling bond. Such low-k dielectric films, such as OSG films, provide a lower dielectric constant than stoichiometric $SiO_2$. However, exposing such low-k dielectric films to plasma etch processes can damage the surface of the exposed low-k dielectric films. Similarly, plasma ash processes for removing masking materials, such as photoresist, that define the trench and via locations, can also damage the exposed surfaces of the low-k dielectric. For example, the plasma ash damage in these low-k dielectric films, such as OSG films, can be caused by a chemical reaction between constituents of the material and the excited species in the plasma. Specifically, the low-k dielectric film can be damaged by the conversion of silicon-hydrocarbon bonds in the material to silicon-hydroxide bonds when the material is exposed to oxidizing or reducing plasmas. Examples of these undesirable reactions are shown in FIGS. 1B through 1D.

FIG. 1A illustrates, in cross-section, a portion of a partially formed integrated circuit. Underlying structure 3 refers, in a general sense, to underlying structures and layers over which a subsequent metal layer will be formed. As such, underlying structure 3 may include the underlying semiconductor substrate and any epitaxial layers, wells, and doped regions formed at a surface of the substrate, overlying dielectric layers, conductive levels including polysilicon or metal gate layers and levels, and previous metal levels, including refractory metals, copper, or aluminum metallization. A low-k dielectric film 2, such as an OSG film, is applied over underlying structure 3. In an OSG dielectric film, silicon atoms are bound to three oxygen atoms and to one methyl group ($CH_3$), corresponding to the organic content present in an OSG film. As evident from FIG. 1A, the low-k dielectric film 2 has been etched, using a masking layer 4 defining the features to be etched into the low-k dielectric film 2. Such masking layers are generally photoresist layers, hardmask layers, or any combination thereof, At the exposed locations, low-k dielectric film 2 is etched through to underlying structure 3. Alternatively, for example in the formation of a conductor trench, dielectric film 2 may only be partially etched through at this location.

FIGS. 1B and 1C illustrate, respectively, the reaction of low-k dielectric films, such as OSG films, resulting from a subsequent oxidizing and reducing plasmas, used to remove the remaining portions of photoresist 4 from the surface of dielectric film 2. Oxidizing plasmas, using plasma activated oxygen or $CO_2$, and reducing plasmas, using plasma activated hydrogen, are commonly used in the art for photoresist removal. In either plasma, the bonds between the silicon atoms and the methyl groups in these surface molecules are typically lost or broken. In an oxidizing plasma, hydroxyl groups, as shown in FIG. 1B, may replace the lost methyl groups. Alternatively, in a reducing plasma, as in FIG. 1C, the bonds can be either left dangling (i.e., associated with an unpaired electron spatially localized at the site of the removed methyl group) or a hydrogen atom can attach to the silicon atom in the place of the removed methyl group. During subsequent processing, water molecules can react with the dangling bonds, as shown in FIG. 1D and attach hydroxyl groups either to the dangling bonds at the exposed surfaces of the low-k dielectric film 2, or replacing the hydrogen molecules that bonded to the silicon atom after the hydrogen plasma exposure.

In either case, the plasma process can degrade the integrity of low-k dielectric films 2, such as OSG films. One form of degradation which can increase the k-value of the low-k dielectric film 2 is due to the formation of silanol (Si—OH).

In addition, the plasma damage can convert the surface of the normally hydrophobic low-k dielectric films, such as OSG, into hydrophilic films. Therefore, along with a degraded k-value, the surface of the low-k dielectric film can become vulnerable to chemical attack during exposure to wet chemical clean, which can result in significant loss of critical dimension (CD) control for low-k dielectric film comprising structures.

Thermal annealing of the low-k dielectric films, such as OSG, can negate some of the damage from plasma processing. Such thermal annealing removes some of the physically adsorbed, but unreacted moisture present at the surface of the low-k dielectric film. However, such annealing processes require annealing temperatures in excess of 250° C. for prolonged periods of time, such as on the order of $10^3$ to $10^4$ seconds, or annealing temperatures in excess of 400° C. for brief durations, such as on the order of $10^2$ to $10^3$ seconds. These temperatures and processing times are technically unfavorable, due to concerns of activating other thermal processes, such as copper stress migration. Also, significant equipment costs and increased cycle time are involved in such annealing processes. In addition, plasma-damaged low-k dielectric films that are annealed according to conventional processes, while removing the physically adsorbed moisture, can remain vulnerable to the re-adsorption of moisture and can result in the further formation of Si—OH in the low-k dielectric films.

Additionally, other properties of some low-k dielectric materials, such as in ULK dielectric materials, can lead to significant process integration challenges. ULK materials achieve lower k-values through the incorporation of non-polar covalent bonds (typically from the addition of carbon) and the introduction of porosity to decrease film density. These changes break the continuity of the Si—O—Si lattice of traditional oxides, leaving porous ULK dielectric films mechanically weaker than other dielectric films. Consequently, ULK dielectric films are more susceptible to kinetic plasma damage that can substantially increase their effective k-value. In some cases, the porous ULK films can collapse and thus densify, resulting in a higher k-value. Porous ULK films are also susceptible to the intercalation of plasma species, residues, solvents, moisture, and precursor molecules that can either adsorb into, outgas from, or chemically modify the film.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

In a first embodiment of the present invention, a method of forming an interconnect structure for an integrated circuit is provided, comprising the steps of providing a substrate and forming a dielectric stack on the substrate comprising an etch-stop layer, a low-k dielectric layer on the etch-stop layer, and a hardmask layer on the low-k dielectric layer. The method also comprises the steps of patterning a photoresist masking layer on the dielectric stack to define a plurality of feature defining regions and plasma processing the substrate in a plasma-based reactor, the plasma processing comprising etching a plurality of features into the dielectric stack in the feature defining regions and performing a plasma repair process in situ in the same plasma-based reactor. The plasma treatment process comprises flowing the hydrocarbon into the reactor and generating a plasma, wherein a mass flow rate of the hydrocarbon into the plasma based reactor is at least 0.1 sccm, and forming a metal conductor in the plurality of features.

In a second embodiment of the present invention, a method of forming an interconnect structure for an integrated circuit is provided, comprising the steps of providing a substrate and forming a dielectric stack on the substrate comprising an etch-stop layer, a low-k dielectric layer on the etch-stop layer, and a hardmask layer on the low-k dielectric layer. The method also comprises the steps of patterning a photoresist masking layer on the dielectric stack to define a plurality of feature defining regions and plasma processing the substrate in a plasma-based reactor, the plasma processing comprising first etching a plurality of features into the dielectric stack in the feature defining regions. A plasma ash process is performed in the same plasma-based reactor, and a plasma repair process in situ also in the same plasma-based reactor. The plasma repair process comprises flowing a hydrocarbon into the reactor and generating a plasma, wherein a mass flow rate of the hydrocarbon into the plasma based reactor is at least 0.1 sccm, and forming a metal conductor in the plurality of features.

In a third embodiment of the present invention, a method of forming an interconnect structure in an integrated circuit is provided, comprising the steps of providing a substrate having an dielectric stack thereon, the dielectric stack comprising an etch-stop layer, a low-k dielectric layer on the etch-stop layer, and a hardmask layer on the low-k dielectric layer. A photoresist masking layer is then patterned on the dielectric stack to define a plurality of feature defining regions. Subsequently, plasma processing is performed in a plasma-based reactor, the plasma processing comprising etching the plurality of features into the hardmask layer and into at least a portion of the low-k layer dielectric layer in the feature defining regions, wherein the first plasma etch process preferentially etches the low-k dielectric layer over the etch-stop layer. A first in situ plasma ash process is also performed using the same plasma-based reactor. Without removing the substrate from the plasma-based reactor, the plurality of features are further etched into a remaining portion of the low-k layer dielectric layer stack and the etch-stop layer. An in situ plasma treatment process is then performed in the same plasma-based reactor. The plasma repair process comprises flowing a hydrocarbon into the reactor and generating a plasma, wherein a mass flow rate of the hydrocarbon into the plasma based reactor is at least 0.1 sccm. A second in situ plasma ash process is then performed in the plasma-based reactor. A residual portion of the patterned masking layer is removed from the substrate and a metal conductor is formed in the plurality of features.

DETAILED DESCRIPTION OF THE INVENTION

Figure 1A:
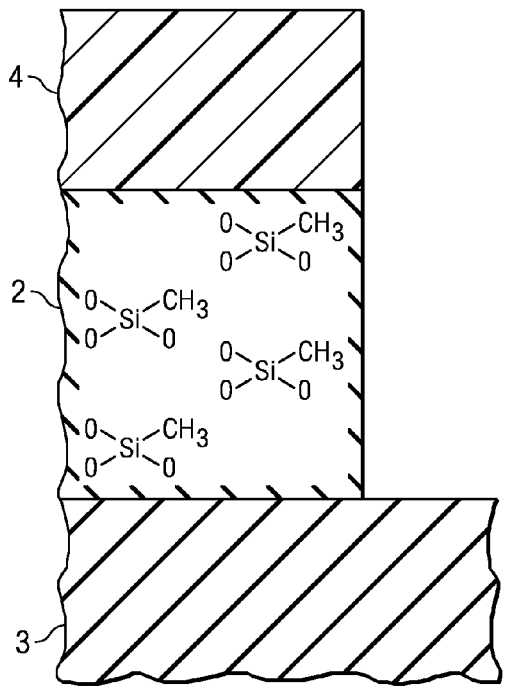
FIG. 1A is a cross sectional view of a portion of an integrated circuit structure, formed according to conventional methods.
Figure 1B:
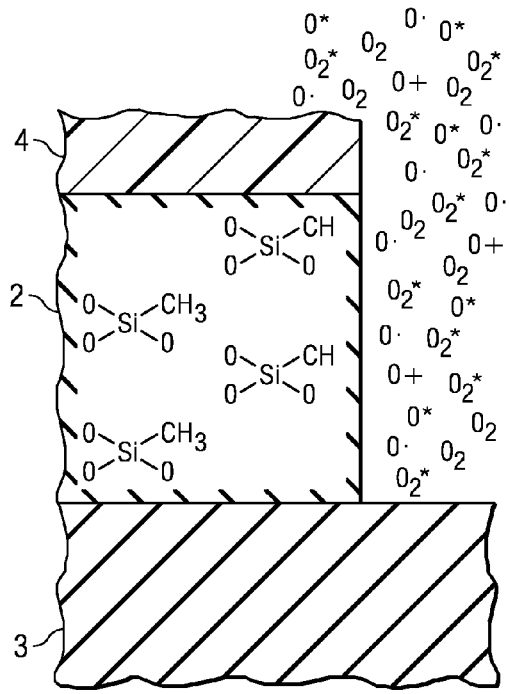
FIGS. 1B-1D are cross sectional views of the portion of the integrated circuit shown in FIG. 1A, illustrating the result of reactions that can be associated with plasma ash damage upon exposed low-k dielectric films.
Figure 1C:
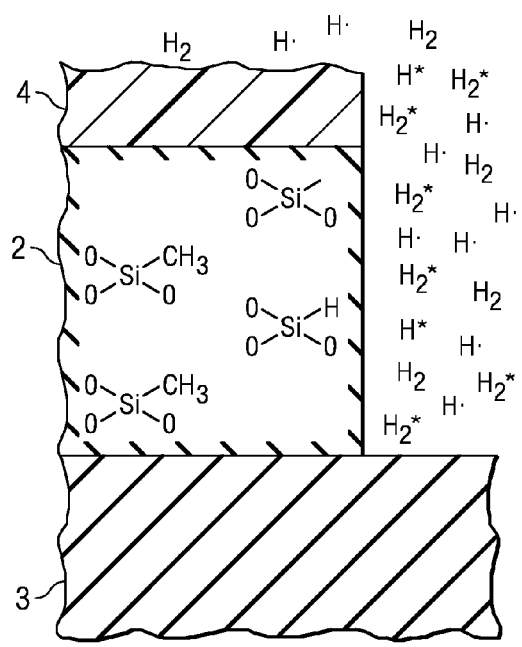
Figure 1D:
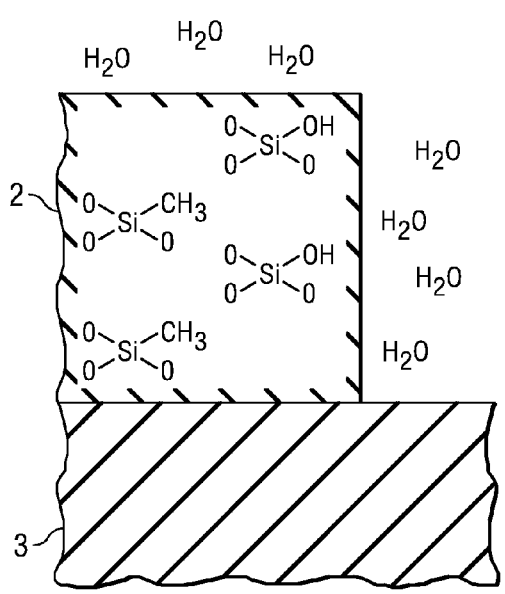

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 2A:
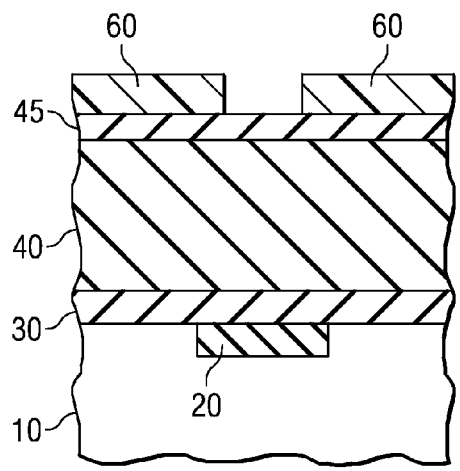
FIGS. 2A-2F are cross sectional views of intermediate steps according to a full via-first dual damascene process in accordance with an embodiment of the present invention.
Figure 2B:
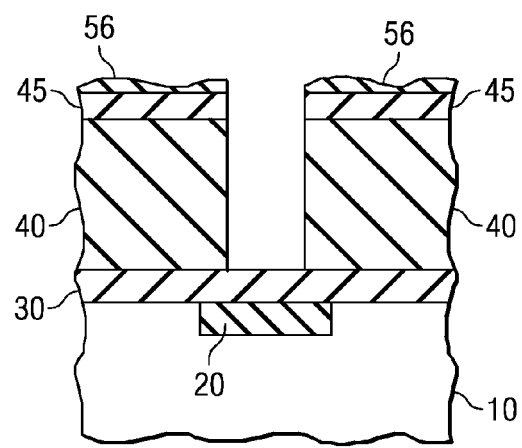
Figure 2C:
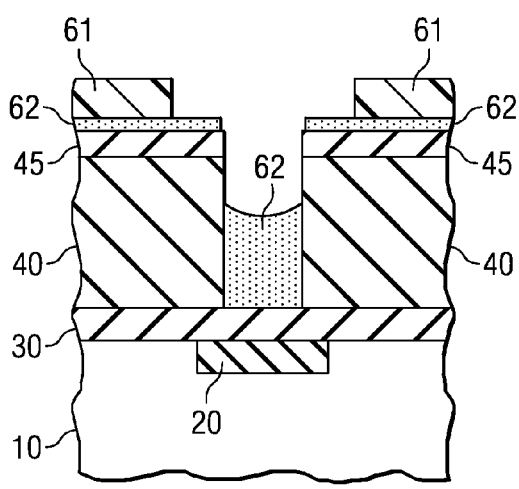
Figure 2D:
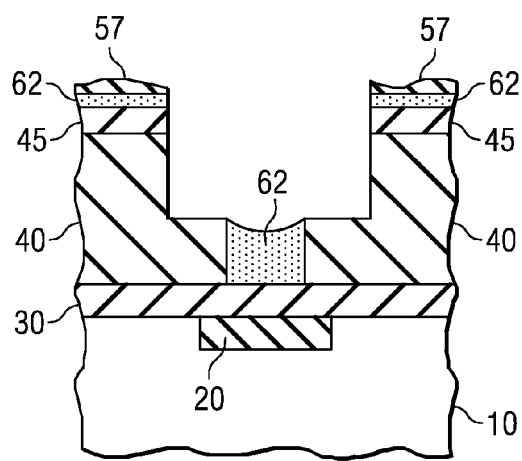
Figure 2E:
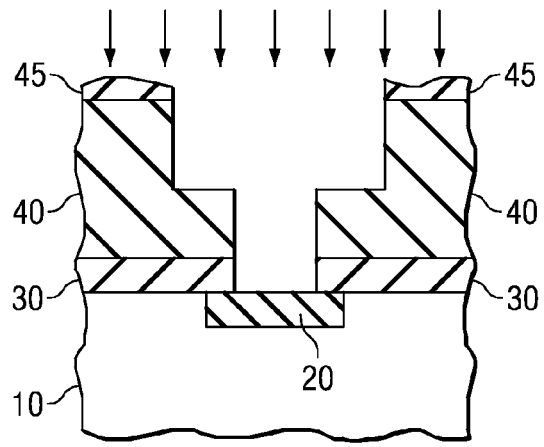
Figure 2F:
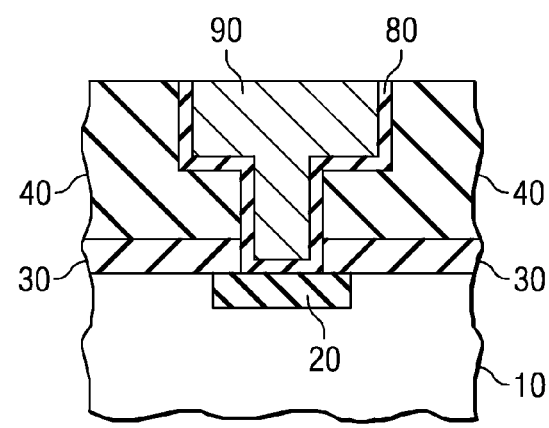
Figure 2G:
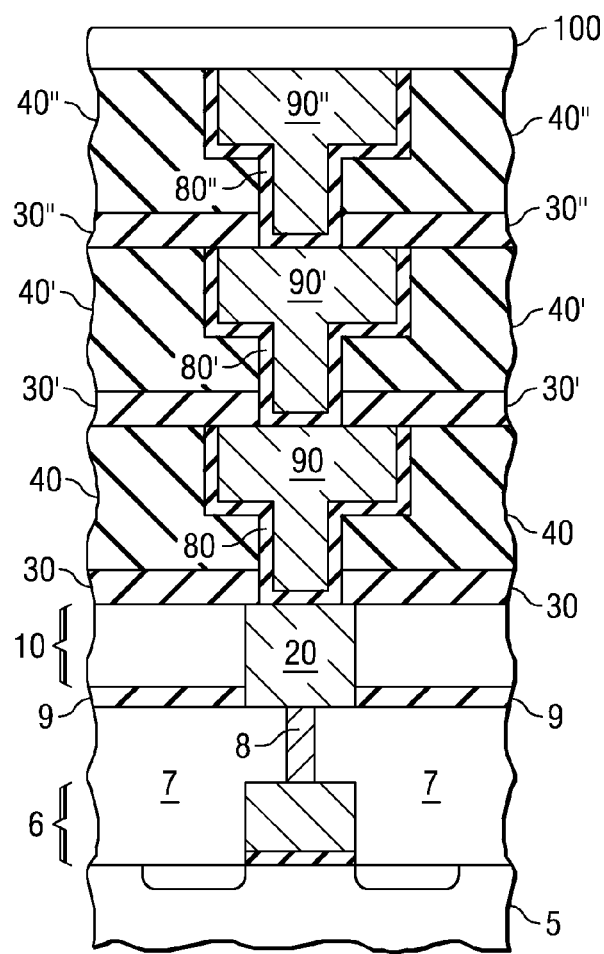
FIG. 2G is a cross sectional view of a completed integrated circuit interconnect structure fabricated in accordance with an embodiment of the present invention.

Referring now to FIGS. 2A through 2G, the construction of an integrated circuit according to an embodiment of the invention will now be described. This example refers to a full via-first dual damascene copper metallization process flow, although of course the invention can be used in connection with other processes and process flows, such as trench-first dual damascene or single damascene processes. FIGS. 2A-2F illustrate, in cross-sections, portions of a partially fabricated integrated circuit, having metal conductor 20 disposed in and isolated from other conductors and active structures by dielectric layer 10. The metal conductors 20, 90, 90', and 90", as illustrated in FIG. 2G, can connect down to active devices 6 by a metal via 8. The active devices can be isolated from each other by a dielectric layer 7. As illustrated in FIG. 2G, a dielectric layer 7 can overly a semiconductor surface of a substrate 5 and the active devices 6, such as transistors, resistors, diodes and the like. Dielectric layers 7 and 10 can be formed from the same or different dielectric materials, such as $SiO_2$, OSG, fluorinated silica glass (FSG), phosphorous-doped silica glass (PSG), or any other suitable dielectric material. Conductors 20 in the dielectric layer 10 can be formed according to the embodiments of the invention. For example, the dielectric layers 7 and 10 can be separated by etch-stop and/or adhesive layers 9, as described below. For purposes of this description, however, the method according will be described in connection with the formation of a metal interconnect layer in overlying dielectric layer 40 using a full via-first method.

As shown in FIGS. 2A-2G, etch-stop layer 30 can be disposed over dielectric layer 10 and metal conductor 20. Low-k dielectric layer 40 can be deposited over etch-stop layer 30. In this exemplary embodiment of the invention, low-k dielectric layer 40 can be a substitution group depleted silicon oxide low dielectric constant material, such as an OSG. Examples of such OSG materials include the CORAL™ family of low-k dielectrics available from Novellus Systems, Inc. and the BLACK DIAMOND™ family of low-k dielectric available from Applied Materials. However, other organosilicate materials can also be used with the invention, such as the LKD™ series of dielectric materials available from JSR Corporation, of which LKD-5109™ is a particular example. Numerous other types of organosilicate and OSG materials can be used with various embodiments of the present invention. The low-k dielectric layer 40 can be deposited in the conventional manner for such material, either by a spin-on technique or by chemical vapor deposition (CVD), as appropriate for the particular material. Etch-stop layer 30 can be formed of a material resistant to etchants for etching low-k dielectric layers 40, as used to form a via to metal conductor 20, for example. Etch-stop layer 30 can also operate as an adhesion layer to enable low-k dielectric layer 40 to adhere to dielectric layer 10. Materials useful for the etch-stop layer 30 include silicon nitrides, silicon carbides, other etch-resistant materials, or any combination of layers thereof and can have relatively low dielectric constants. For example, an etch-stop layer 30 can comprise a layer of SiCN or $Si_3N_4$, a SiCO/SiCN stack, or a SiCO/$Si_3N_4$ stack.

In some instances, a hardmask layer 45, as shown in FIGS. 2A-2E, can be optionally formed over the surface of low-k dielectric layer 40. Hardmask layer 45 can be a material resistant to etch processes used to etch vias as well as trenches, and can be formed from either conductor, semiconductor, or insulator materials. Examples of materials for hardmask layer 45 can include silicon nitride, silicon carbide, tantalum nitride, and titanium nitride.

Optionally, a cap dielectric layer (not shown) can overlie low-k dielectric layer 40 and hardmask layer 45. Such a cap dielectric layer can protect the remaining thickness of low-k dielectric layer 40 from subsequent via, trench, or etch-stop etches, and from chemical mechanical polishing (CMP) after metal deposition. Examples of the material of such a cap dielectric layer can include TEOS, silicon carbide, silicon carbonitride, titanium aluminum nitride, titanium nitride, aluminum nitride, tantalum aluminide, tantalum aluminum nitride, and other similar materials.

As shown in FIG. 2A, photoresist 60 can be deposited over the surface of hardmask layer 45, and photolithographically patterned to define regions in which vias or other features are to be formed through dielectric layer 40, extending to lower level metal conductor 20. The particular material for photoresist 60 can depend upon the photolithography wavelength and process to be used, as well as upon the target dimensions for the via. A bottom anti-reflective coating, or BARC, (not shown) can optionally be applied prior to photoresist 60, to underlie photoresist 60 and assist in the photolithography used to pattern photoresist 60.

After the patterning of photoresist 60, the defined feature regions can be first etched into the hardmask layer 45, and optionally cap dielectric layers. The patterned features can then be etched into the low-k dielectric layer 40 using the hardmask layer 45 and photoresist 60 as a masking layer. The etches can be plasma etches, of sufficient energy, duration, and plasma conditions to etch low-k dielectric layer 40 through to etch-stop layer 30, resulting in the via opening illustrated in FIG. 2B. In some cases, the plasma etches for the low-k dielectric layer can also be used to etch the hardmask layer 45, dielectric cap layers, or any combination thereof. Etch processes can include processes developed using reactive ion etching (RIE), deep RIE, or plasma enhanced chemical dry etching (CDE) reactors, to name a few. Anisotropic etch processes can be used to provide increased critical dimension (CD) control. The etch process used to remove hardmask layer 45 and the low-k insulator layer 40 depends on the composition of the hardmask layer 45 and the low-k dielectric layer 40. An example of a suitable etch for low-k dielectric layer 40, such as an OSG dielectric film, can be a plasma etch process using fluorocarbons as the activated species.

The masking portions of photoresist 60 are typically reduced by plasma etch processes and can leave photoresist residue 56 at the protected locations of hardmask layer 45 and low-k dielectric layer 40, as shown in FIG. 2B. This residue 56 can also include residue from a BARC layer, if used. Subsequently, the residue 56 can be removed from the surface of hardmask layer 45 or the low-k dielectric layer 40, by exposure to a plasma ash process, as is conventionally performed in the art. For example, a suitable ash process for a low-k dielectric layer 40, such as an OSG film, can be a plasma ash process using $H_2$, $O_2$, $CO_2$, or other oxygen-containing gases. Afterwards, an additional wet clean can be performed to remove any remaining residue.

Although not necessary to practicing the present invention, the present Inventors, not seeking to be bound by any mechanistic details described below or anywhere else in the present application, provide the following description. Plasma processes used to etch the hardmask layer 45, to etch the low-k dielectric layer 40, and/or to remove photoresist residue 56 and other polymer residues (e.g., BARC residue) can cause damage to exposed portions of low-k dielectric layer 40, such as via or trench sidewalls. Furthermore, it is believed that the plasma processes can cause undesirable reactions at the exposed surfaces of low-k dielectric layer 40. For example, during an oxidizing plasma, the methyl groups bonded to the silicon atoms in a low-k dielectric layer 40, such as an OSG layer, can be removed and/or replaced, resulting in what is commonly referred to in the art as carbon depletion. In another example, during a reducing plasma, dangling bonds or Si—H bonds can form on exposed surfaces of the low-k dielectric layer 40. These bonds can further react with moisture in the ambient or introduced in later wet chemical cleans or other wet processes, to form Si—OH in such low-k dielectric layers 40. In either case it is believed that the resulting Si—OH bonds increase the dielectric constant of dielectric layer 40 at these surface locations, degrading the electrical isolation provided by dielectric layers 40, such as OSG, between adjacent conductors.

Furthermore, because Si—OH also tends to absorb moisture during subsequent processes, it is believed that plasma processes further degrade other properties in dielectric layers 40. For example, the presence of the Si—OH at the surface of the sidewalls of an etched via or trench can render these portions of low-k dielectric layers 40, such as in OSG films, more vulnerable to etching during subsequent wet cleans, such as the via wet clean that occurs typically following a plasma ash process. Additionally, as feature size is further reduced, the amount of damage can become more significant. For example, for a narrow line width of 45 nm, a 20 nm damage layer (10 nm on each trench sidewall) can represent a significant portion of the dielectric width, reducing or outright eliminating many of the advantages of employing low-k dielectrics, and particularly ULK dielectrics.

In one embodiment of the invention, after one or more damaging plasma processes, the exposed surface of the low-k dielectric layer 40 can be exposed to a plasma treatment or repair processes with an activated hydrocarbon species in situ. Furthermore, the in situ plasma treatment process can be added between a plasma etch step and an in situ plasma ash step. Thus all three (3) steps can be performed in the same plasma-based reactor without the need to remove the wafer from the reactor between the three steps. Process flows including such plasma treatment or plasma repair steps have been found by the present Inventors to provide several advantages. In particular, such a process flow can negate, repair, and prevent subsequent plasma damage in a dielectric layer 40, such as in an OSG film. In the case of an OSG film, the plasma activated species generated from the hydrocarbon can also be selected to provide certain properties in the resulting film. For example, because the result of exposure of a low-k dielectric, such as OSG, to an activated species during etch and ash processes is generally the removal or replacement of methyl groups, i.e., carbon depletion, a plasma treatment process can be provided to provide plasma activated hydrocarbon radicals which can bond with dangling bonds in a damaged low-k dielectric, such as OSG. For example, $CH_4$, $C_2H_6$, $C_3H_8$, or other hydrocarbons ($C_xH_y$, where x, y>1) can be used to provide plasma activated hydrocarbon radicals that can react with the damaged exposed surfaces of the OSG film. Additionally, other saturated hydrocarbon compounds ($C_nH_{2n+2}$, where $n \geq 4$), unsaturated compounds ($C_nH_{2n}$, where $n \geq 1$), cycloalkanes, and aromatic compounds can also be used as hydrocarbon radical precursors.

Known methods of preventing degradation of the exposed portions in low-k dielectric layers 40, such as OSG films, have included exposing the low-k dielectric layers 40 to thermally or plasma driven processes designed to provide nitrogen, fluorine, or hydrogen in downstream tools. In such methods, reactive species are produced that react with the dangling bonds and passivate the surface of the damaged low-k dielectric layers 40, such as OSG films. However, even if such exposed surfaces are treated prior to a wet clean, they have been found by the present Inventors to still be vulnerable to absorption of moisture or other contaminants from the ambient prior and during plasma treatment, which can result in some degradation of dielectric properties. Therefore, such methods can only prevent further degradation and cannot generally repair any damage to low-k dielectric films, such as OSG films. Furthermore, because such methods are generally performed in separate tools (not in situ), such as downstream plasma tools and require several minutes of processing per wafer, a significant amount of additional processing time is generally required. For example, additional cycle time may be added because of loading and unloading times, as well as the processing time. Costs are also added due to the need of additional downstream tools and associated maintenance and operation costs. Moreover, even if such processes were to be performed in situ, the replacement of depleted carbon with nitrogen, hydrogen, or fluorine atoms or groups results in a generally undesirable change (not a repair) in the chemical properties of the exposed portions of the low-k dielectric films, such as OSG films. The change in the chemical properties can result in a change in electrical properties, such as the k-value.

The present invention, in contrast, provides a method for both passivating and repairing exposed surfaces of low-k dielectric films, such as OSG films, while adding only minimal cycle time and costs. In particular, for a plasma etch process that comprises a plasma etch step and an in situ plasma ash step, an additional in situ hydrocarbon plasma treatment step, according to the present invention, can be added. By performing all the steps in situ, that is the etch, the treatment, and the ash processes being consecutively performed in the same chamber, the exposed low-k dielectric layer 40 is unlikely to be exposed to moisture or other contaminants and reduces the amount of processing time required compared to previous methods.

Figure 3:
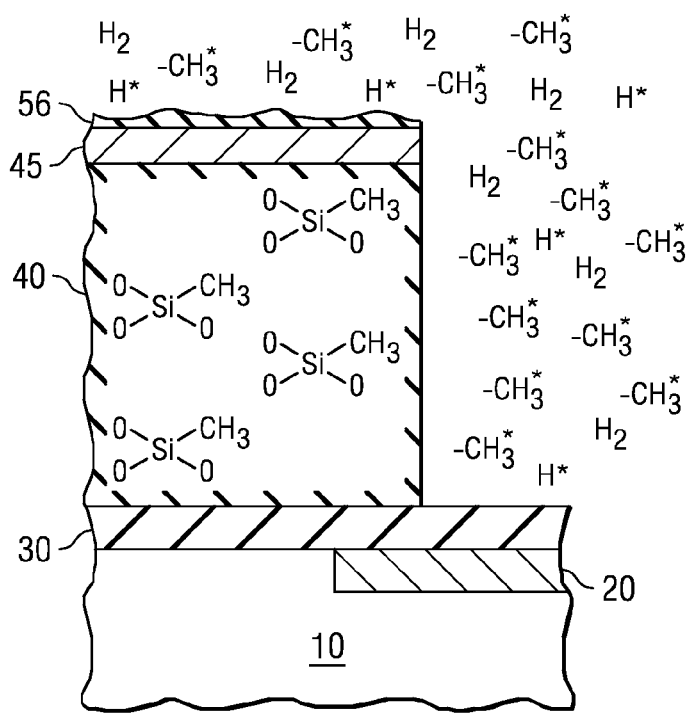
FIG. 3 is a cross sectional view of a portion of the integrated circuit of FIGS. 2A-2G, illustrating the reaction for treatment of plasma damage in accordance with an embodiment of the present invention.

Furthermore, it is believed by the present Inventors, although not essential for practicing the invention, that the number of dangling bonds on surface of the exposed low-k dielectric layer 40 can be reduced by passivating the bonds using reactive hydrocarbon radicals. FIG. 3 illustrates the result of exposing a damaged low-k dielectric layer 40, such as an OSG film, to a plasma using $CH_4$ as a hydrocarbon radical precursor. It is believed that reactive radicals ($CH_3$ and H) resulting from the plasma process interact with the surface of a carbon depleted low-k dielectric layer 40 and converted Si—$CH_3$ bonds are formed near the surface of the dielectric layer 40.

Such plasma etch process flows according to the present invention have been found by the present Inventors to be advantageous over prior methods using fluorine, hydrogen, or nitrogen. In particular, it is believed that rather than forming a chemically altered chemical composition on the surface of exposed low-k dielectric films, such as OSG films, a chemically equal or at least similar type of material can be formed, thus providing electrical and mechanical properties which more closely resemble that of a as-deposited low-k dielectric layer 40, such as an OSG film.

It is also believed, although not essential for practicing the invention, that process flow according to the present invention provides polymerizing hydrocarbon plasma chemistries that can provide additional advantages aside from providing a source of hydrocarbon radicals to passivate the dangling bonds in an low-k dielectric layer 40. In at least some embodiments, it is believed that the hydrocarbon plasma treatment process generates a polymerizing plasma which can deposit a thin layer of polymer (not shown) on the surface of the exposed low-k dielectric layer 40. An exemplary process believed to provide such a plasma can be performed using a Tokyo Electron Limited (TEL) SCCM etcher. Exemplary processes in this etcher comprise using a reactor wafer chuck temperature between 20° C. and 60° C., a chamber pressure between 5 and 50 mTorr, a RF source power between 100 to 1000 W, a bias power between 0 and 1000 W, a hydrocarbon mass flow rate of 0.1-300 sccm, and an inert mass gas flow rate between 0 and 500 sccm. For this exemplary process, only a brief plasma repair process can be required, such as 5 to 60 seconds. This and other plasma treatment processes according to the present invention, can be incorporated as an additional step in an etch process that includes a plasma etch step and an in situ plasma ash step. In one exemplary process, the mass flow rate of a hydrocarbon, such as $CH_4$, introduced into the plasma chamber is at least 100 sccm and a mass flow rate of an inert gas, such as argon (Ar), is 100 sccm. However, as noted above, the amount of Ar can be reduced or eliminated in other processes according to the present invention.

The thin layer of polymer believed to be deposited on the exposed surfaces of the dielectric layer 40 can provide additional protection during subsequent processing. First, because surfaces of the dielectric layer 40 are believed to be polymer coated and are no longer exposed, they are not exposed to any contaminants, even when inadvertently removed from the process tool or the etch process is interrupted. Second, it is believed that the polymer present during subsequent plasma processes can reduce the amount of damage induced on the exposed portions of the low-k dielectric layer 40, as subsequent plasma processes would have to remove the polymer prior to reacting with the low-k layer 40. Therefore, it is believed that the amount of time the exposed low-k dielectric layer 40, such as an OSG film, is subjected to a damaging plasma ash process can be reduced and accordingly, the amount of damage is also reduced. Furthermore, in processes where the in situ plasma ash process is an anisotropic plasma process, the amount of damage can be reduced further, as the majority of the plasma would be directed to the surface perpendicular to the plasma bias, not to polymer coated sidewalls.

Following the plasma treatment and the plasma ash, additional photoresist 61 can be deposited over the surface of hardmask layer 45, and photolithographically exposed and developed to define any trench features to be formed through a portion of the low-k dielectric layer 40, as shown in FIG. 2C. The particular material for photoresist 61 can depend upon the photolithography wavelength and process to be used, as well as upon the dimensions of the eventual trench. As previously described, a bottom anti-reflective coating, or BARC 62 can optionally be applied prior to photoresist 61, to underlie photoresist 61 and assist in the photolithography used to pattern photoresist 61. The BARC layer 62 can fill the previously etched via and can provide additional protection for the etch stop layer during the plasma trench etch step.

After the patterning of photoresist 61, the trench features can be first etched into the hardmask layer 45 and into any cap dielectric layers that have been deposited. The trench features can then be etched into the low-k dielectric layer 40. As previously described, these etches can be plasma etches, of sufficient energy, duration, and plasma conditions to etch a portion low-k dielectric layer 40, resulting in the trench structure illustrated in FIG. 2D. In some cases, the plasma etches can also be used to etch the hardmask layer 45, any dielectric cap layers, or any combination thereof. As previously mentioned, the etch process can include processes developed using reactive ion etching (RIE), deep (RIE), physical etching, or other types plasma enhanced chemical dry etching (CDE) reactors. Furthermore, anisotropic plasma etch processes, as previously described, can be used to maintain critical dimension (CD) control of the trench. As with the via etch process, the masking portions of photoresist 61 can be reduced by the trench etch step and can leave photoresist residue 57 at the protected locations of hardmask layer 45 and low-k dielectric layer 40, as shown in FIG. 2D. This residue 57 can also include residue from a BARC layer 62, if used. Such residue 57 and the BARC 62 can be removed from the surface of hardmask layer 45, by use of a plasma ash process. For example, as previously described, a suitable plasma ash process for low-k dielectric materials, such as OSG, can be a plasma ash process using $H_2$, $O_2$, $CO_2$, or other oxygen-containing gases.

As in the via etch process described above, an in situ plasma treatment step, according to the present invention, can be added as an additional in situ step during the trench etch process between the plasma etch step and an in situ the plasma ash step. As previously described, the inclusion of the in situ plasma treatment step is believed to repair damage to the low-k dielectric layer 40 resulting from the plasma etch step and to protect the low-k dielectric layer 40 from further damage during the plasma ash step.

After the trench etch process is complete, the etch-stop layer 30 can be removed from the bottom of the via by etching, as shown in FIG. 2E. This etch also removes all or portions of hardmask layer 45, followed by a plasma ash process to remove any residue still remaining on the wafer. Again, as in the via and trench etch processes, an in situ plasma treatment step, according to the present invention, can be added as an additional step of the etch-stop removal process between the plasma etch step and an in situ plasma ash step and is believed to prevent or repair damage to the low-k dielectric layer 40 resulting from the plasma etch step and to protect the low-k dielectric layer 40 from further damage during the subsequent plasma ash step. Afterwards, an additional wet clean can be performed to remove any remaining residue.

Referring to FIG. 2F, the metallization process then continues, once etch-stop layer 30 is removed from the bottom of the via. In this exemplary embodiment of the invention, liner layer 80 can be formed of the suitable material over all features. Examples of suitable materials for use as liner layer 80 include titanium nitride, tantalum nitride, tungsten nitride, and the like. After deposition, liner layer 80 will extend not only into the via to lower level conductor 20, but also over the surface of insulating layer 40. Metal 90, such as aluminum (Al), copper (Cu), or other electrically conductive metals and their alloys, including Cu/Al alloys, can be deposited (or, in the case of copper or other metals, electroplated) overall, into the etched portions of the dielectric layer 40 and also on the surface of dielectric layer 40 and liner layer 80, and perhaps also on hardmask layer 45 (especially if layer 45 is electrically conductive). Chemical mechanical polishing (CMP) can then be performed to remove metal 90 and liner layer 80 from the top surface of dielectric layer 40, leaving a conductive plug within the via through dielectric layer 40, flush with the top surface of dielectric layer 40. The resulting structure at this point is illustrated in FIG. 2F. The remainder of the interconnect processing then continues in the same, cyclical, manner, to form additional metal conductor levels comprising additional low-k dielectric layers (40',40"), additional etch-stop layers (30',30"), additional liner layers (80', 80"), and additional metal layers (90', 90"), as illustrated in FIG. 2G. A cap layer 100, comprising a thick cap dielectric material (e.g., TEOS) can be deposited on the interconnect structure. Once the fabrication process is complete, the integrated circuit can be tested and packaged.

EXAMPLES

It should be understood that the exemplary plasma treatment process described herein is for illustrative purposes only and that various modifications or changes in light thereof will be suggested to persons skilled in the art and are to be included within the spirit and purview of this application. The invention can take other specific forms without departing from the spirit or essential attributes thereof.

Figure 4:
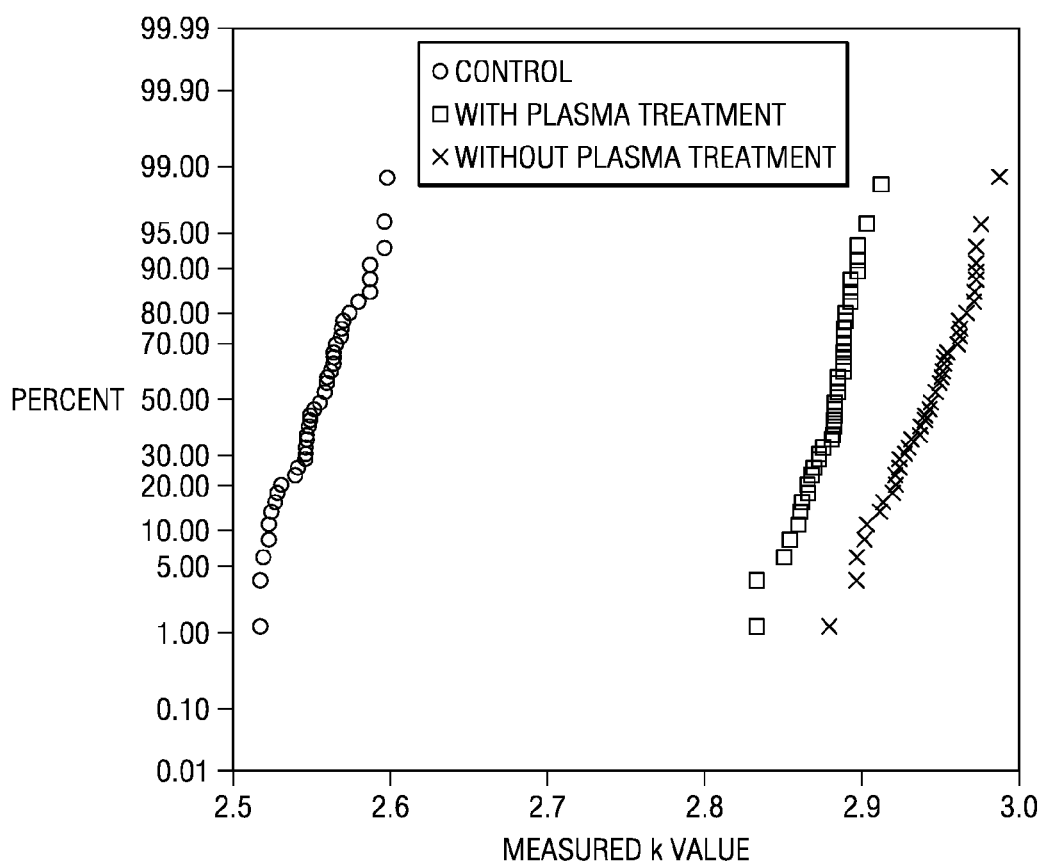
FIG. 4 is a cumulative plot of measured dielectric constant (k-values) for control blanket ULK dielectric films (as applied) and measured k-values for blanket ULK dielectric films after exposure to a plasma ash process ($CO_2$-based), with and without exposure to a pre-plasma ash hydrocarbon-based (100 sccm $CH_4$, 100 sccm Ar) plasma treatment process in accordance with an embodiment of the present invention.

FIG. 4 provides a cumulative plot of measured k-values for control blanket ULK dielectric films (as applied) on silicon substrates, measured k-values for blanket ULK dielectric films on silicon after exposure to a plasma ash process, and measured k-values for blanket ULK dielectric films on silicon after exposure to an in situ plasma treatment process followed by exposure to an in situ plasma ash process in accordance with an embodiment of the present invention. The plasma ash process comprised a $CO_2$-based plasma ash process in a TEL SCCM etcher, as previously described. The in situ plasma treatment process, carried out in a TEL SCCM etcher, comprised a reactor wafer chuck temperature of 20° C., a pressure of 10 mTorr, a RF source power of 750 W, a bias power of 500 W, with a $CH_4$ flow rate of 100 sccm, and an Argon (Ar) flow rate of 100 sccm. For this process, a plasma treatment process time of 15 seconds was used.

The cumulative plots provide data showing the effect of the plasma treatment process on low-k dielectric layers subjected to plasma ash processes. In particular, the data shows that a plasma treatment step can improve the k-value for a low-k dielectric film subjected to a plasma ash process. As shown in FIG. 4, the measured k-value of the blanket ULK dielectric film including an in situ plasma treatment step prior to the plasma ash step, as previously described, is shown to be substantially improved over the measured k-value for the process excluding the plasma treatment step. For example, at the 99th percentile, the difference between the two processes results in a difference in k-value of ~0.1. In terms of the original k-value, the process including a plasma treatment step results in only an increase of ~11.5% in k-value versus an increase of ~15.4% when the plasma treatment step is not used. Therefore, it is believed that the plasma treatment step operates to reduce the effects of the plasma ash processes to smaller depths of the exposed surfaces of in low-k dielectric films, such as OSG films. Accordingly, using the present invention, the effects of the plasma etch and plasma ash processes may be confined to a smaller depth of the exposed sidewalls of a trench or a via etched into low-k dielectric layers.

While this invention has been described according to an exemplary embodiment, it is of course contemplated that still other modifications of, and alternatives to, these embodiments, such modifications and alternatives obtaining the advantages and benefits of this invention, will be apparent to those of ordinary skill in the art having reference to this specification and its drawings. For example, alternatively or in addition to performing a plasma treatment step prior to a plasma ash step, a plasma repair step can be performed after the plasma ash step, using the same process parameters described above for the plasma treatment processes. In another example, the hydrocarbon can be introduced during the plasma etch step to protect the portions of the low-k dielectric layer 40 as they become exposed. In yet another example, the steps of trench etch processes and the etch-stop etch processes can be combined into a single process executed in a single tool. In such combined processes, a plasma treatment step or a plasma repair step can be performed after each etch or ash step of the combined process or can be only performed after one or more selected steps of the combined process. For example, a process can include a plasma treatment step only after the etch-stop etch step.

Other modifications to the invention as described above are within the scope of the claimed invention. As an example, as noted above, the present invention can be used on one or every dual damascene layer of the interconnect structure, as well as on a single damascene metal process. In addition, it is within the scope of the invention to have interconnect structures with different amounts or configuration of metal layers than is shown in FIGS. 2A-2G. Moreover, dual damascene layers can be fabricated using either a via-first (described above) or a trench-first process. Such processes can include full or partial via etch processes. Additionally, in either the via-first or the trench-first processes, the etch-stop layer can be etched in situ during the via etch process.

As previously noted, the interconnect structures can contain other layers, such as a thin capping layer (e.g. TEOS) between the any dielectric layers 40 and their respective adjoining etch-stop 30 or hardmask 45 layers. Furthermore, although not shown above, dielectric layer 40 can include a trench etch-stop layer therein as known in the art. Furthermore, the semiconductor substrate 5 can include various elements therein and/or layers thereon. These can include metal layers, barrier layers, dielectric layers, device structures, active elements and passive elements including word lines, source regions, drain regions, bit lines, bases, emitters, collectors, conductive lines, conductive vias, etc. Moreover, instead of using the invention on a CMOS structure as described above, the invention is applicable to other semiconductor technologies such as BiCMOS, bipolar, SOI, strained silicon, pyroelectric sensors, opto-electronic devices, microelectrical mechanical system (MEMS), or SiGe.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method of forming an interconnect structure for an integrated circuit, comprising the steps of:
   providing a substrate;
   forming a dielectric stack on said substrate comprising an etch-stop layer, a low-k dielectric layer on said etch-stop layer, and a hardmask layer on said low-k dielectric layer;
   patterning a photoresist masking layer on said dielectric stack to define a plurality of feature defining regions;
   plasma processing said substrate in a plasma-based reactor, said processing comprising etching a plurality of features into said hardmask layer and into at least a portion of said low-k dielectric layer in said feature defining regions, and performing a plasma treatment process in situ in said plasma-based reactor, said plasma treatment process comprising flowing at least one hydrocarbon into said reactor and generating a plasma, wherein a mass flow rate of hydrocarbon into said plasma based reactor is at least 0.1 sccm; and
   forming a metal conductor in said plurality of features.

2. The method of claim 1, wherein said mass flow rate of said hydrocarbon is at least 1 sccm.

3. The method of claim 1, wherein said mass flow rate of said hydrocarbon is at least 10 sccm.

4. The method of claim 1, wherein said hydrocarbon is at least one selected from the group consisting of $CH_4$, $C_2H_6$, $C_3H_8$, other saturated hydrocarbons ($C_nH_{2n-2}$ where $n \geq 1$), and unsaturated hydrocarbons ($C_nH_2$ where $n \geq 1$).

5. The method of claim 1, wherein said low-k dielectric layer is deposited as a CVD film or a spin-on film.

6. The method of claim 1, wherein said etch-stop layer comprises SiCN, SiCO/SiCN, $Si_3N_4$ or $SiCO/Si_3N_4$.

7. The method of claim 1, wherein said plasma processing step further comprises removing said masking layer using a plasma ash process in situ in said plasma based reactor, wherein a precursor for said plasma ash process is selected from the group consisting of $H_2$, $O_2$, and $CO_2$.

8. The method of claim 7, wherein said plasma processing step further comprises performing a plasma repair process in situ in said plasma-based reactor after removing said masking layer, said plasma repair process comprising flowing at least one hydrocarbon into said reactor and generating a plasma, wherein a mass flow rate of said hydrocarbon into said plasma based reactor is at least 0.1 sccm.

9. The method of claim 8, wherein said hydrocarbon for said plasma repair process is at least one selected from the group consisting of $CH_4$, $C_2H_6$, $C_3H_8$, other saturated hydrocarbons ($C_nH_{2n+2}$ where $n \geq 1$), and unsaturated hydrocarbons ($C_nH_2$ where $n \geq 1$).

10. The method of claim 1, further comprising the steps of:
    prior to forming said interconnect structure, forming at least one MOS transistor formed in and on said substrate, said MOS transistor comprising a source and drain having a channel region interposed between, and a gate electrode and a gate insulator over said channel region, a layer of dielectric insulation including at least one metal contact electrically coupled to said transistor, wherein said interconnect structure is electrically coupled to said metal contact.

11. A method of forming an interconnect structure for an integrated circuit, comprising the steps of:
    providing a substrate;
    forming a dielectric stack on said substrate comprising an etch-stop layer, a low-k dielectric layer on said etch-stop layer, and a hardmask layer on said low-k dielectric layer;
    patterning a photoresist masking layer on said dielectric stack to define a plurality of feature defining regions;
    plasma processing said substrate in a plasma-based reactor, said processing comprising etching a plurality of features into said hardmask layer and into at least a portion of said low-k dielectric layer in said feature defining regions, performing a plasma ash process in situ in said plasma-based reactor, and performing a plasma repair process in situ in said plasma-based reactor, said plasma repair process comprising flowing at least one hydrocarbon into said reactor and generating a plasma, wherein a mass flow rate of said hydrocarbon into said plasma based reactor is at least 0.1 sccm; and
    forming a metal conductor in said plurality of features.

12. The method of claim 11, wherein said mass flow rate of said hydrocarbon is at least 1 sccm.

13. The method of claim 11, wherein said mass flow rate of said hydrocarbon is at least 10 sccm.

14. The method of claim 11, wherein said hydrocarbon is at least one selected from the group consisting of $CH_4$, $C_2H_6$, $C_3H_8$, other saturated hydrocarbons ($C_nH_{2n+2}$ where $n \geq 1$), and unsaturated hydrocarbons ($C_nH_2$ where $n \geq 1$).

15. The method of claim 11, wherein said low-k dielectric layer is deposited as a CVD film or a spin-on film.

16. The method of claim 11, wherein said etch-stop layer comprises SiCN, SiCO/SiCN, $Si_3N_4$ or $SiCO/Si_3N_4$.

17. The method of claim 11, wherein a precursor for said plasma ash process is selected from the group consisting of $H_2$, $O_2$, and $CO_2$.

18. The method of claim 11, wherein said plasma processing step further comprises performing a plasma treatment process in situ in said plasma-based reactor after etching said plurality of features, said plasma treatment process comprising flowing at least one hydrocarbon into said reactor and generating a plasma, wherein a mass flow rate of said hydrocarbon into said plasma based reactor is at least 0.1 sccm.

19. The method of claim 11, further comprising the steps of:
    prior to forming said interconnect structure, forming at least one MOS transistor formed in and on said substrate, said MOS transistor comprising a source and drain having a channel region interposed between, and a gate electrode and a gate insulator over said channel region, a layer of dielectric insulation including at least one metal contact electrically coupled to said transistor, wherein said interconnect structure is electrically coupled to said metal contact.

20. A method of forming an interconnect structure in an integrated circuit, comprising the steps of:

providing a substrate;
forming a dielectric stack on said substrate comprising an etch-stop layer, a low-k dielectric layer on said etch-stop layer, and a hardmask layer on said low-k dielectric layer;
patterning a photoresist masking layer on said dielectric stack to define a plurality of feature defining regions;
processing said substrate in a plasma-based reactor, said processing comprising etching a plurality of features into said hardmask layer and into at least a portion of said low-k layer dielectric layer in said feature defining regions, wherein said first plasma etch process preferentially etches said low-k dielectric layer over said etch-stop layer, performing a first in situ plasma ash process in said plasma-based reactor, again etching said plurality of features into a remaining portion of said low-k layer dielectric layer stack and said etch-stop layer, performing an in situ plasma treatment process in said plasma-based reactor, said plasma repair process comprising flowing at least one hydrocarbon into said reactor and generating a plasma, wherein a mass flow rate of said hydrocarbon into said plasma based reactor is at least 0.1 sccm, and performing a second in situ plasma ash process in said plasma-based reactor;
removing a residual portion of the patterned masking layer from said substrate; and
forming a metal conductor in the plurality of features.

21. The method of claim 20, wherein said mass flow rate of said hydrocarbon is at least 1 sccm.

22. The method of claim 20, wherein said mass flow rate of said hydrocarbon is at least 10 sccm.

23. The method of claim 20, wherein said low-k dielectric layer is deposited as a CVD film or a spin-on film.

24. The method of claim 20, wherein said etch-stop layer comprises SiCN, SiCO/SiCN, $Si_3N_4$ or $SiCO/Si_3N_4$.

25. The method of claim 20, wherein said hydrocarbon is at least one selected from the group consisting of $CH_4$, $C_2H_6$, $C_3H_8$, other saturated hydrocarbons ($C_nH_{2n+2}$ where $n \geq 1$), and unsaturated hydrocarbons ($C_nH_2$ where $n \geq 1$).

26. The method of claim 20, wherein a precursor for said plasma ash processes is selected from the group consisting of $H_2$, $O_2$, and $CO_2$.

27. The method of claim 20, further comprising the steps of:
prior to forming said interconnect structure, forming at least one MOS transistor formed in and on said substrate, said MOS transistor comprising a source and drain having a channel region interposed between, and a gate electrode and a gate insulator over said channel region, a layer of dielectric insulation including at least one metal contact electrically coupled to said transistor, wherein said interconnect structure is electrically coupled to said metal contact.

28. A method for manufacturing an integrated circuit including a damascene metallization process, comprising:
providing a substrate having a metal conductor disposed in a first dielectric layer for providing electrical connection to an active device;
forming an etch-stop layer over the first dielectric layer and the metal conductor;
forming a second dielectric layer over the etch-stop layer;
forming a mask over the second dielectric layer;
patterning the mask;
performing a plasma etch through the patterned mask to form an opening in the second dielectric layer;
following the plasma etch, performing an in situ plasma ash to remove etch residue from exposed portions of the second dielectric layer;
following the plasma etch, and before or after the plasma ash, performing an in situ plasma treatment with an activated hydrocarbon species to repair exposed portions of the second dielectric layer; and
following the plasma ash, performing a wet clean to remove remaining etch residue.

29. The method of claim 28, wherein the hydrocarbon species comprises at least one of $CH_4$, $C_2H_6$, $C_3H_8$ or a hydrocarbon $C_nH_{2n+2}$ where $n>3$.

30. The method of claim 28, wherein the plasma ash is an anisotropic plasma ash; the plasma treatment is performed prior to the plasma ash; and the method further comprises performing a second in situ plasma treatment with an activated hydrocarbon species following the plasma ash.

31. The method of claim 28, further comprising, following the wet clean:
forming a second mask over the second dielectric layer;
patterning the second mask layer;
performing a second plasma etch through the second patterned mask to form a second opening (trench or via) in the second dielectric layer; the second opening at least partially coinciding with the first opening; and one of the first or second opening having a bottom extending down to the etch-stop layer;
following the second plasma etch, performing an in situ second plasma ash to remove second etch residue from exposed portions (sidewalls) of the second dielectric layer;
following the second plasma etch, and before or after the second plasma ash, performing an in situ second plasma treatment with an activated hydrocarbon species to repair exposed portions of the second dielectric layer; and
following the second plasma ash, performing a second wet clean to remove remaining second etch residue.

32. The method of claim 31, wherein the hydrocarbon species comprises at least one of $CH_4$, $C_2H_6$, $C_3H_8$ or a hydrocarbon $C_nH_{2n+2}$ where $n>3$.

33. The method of claim 31, wherein the plasma treatment is performed prior to the plasma ash; and the second plasma treatment is performed prior to the second plasma ash.

34. The method of claim 33, further comprising performing a third plasma treatment in situ with an activated hydrocarbon species to repair exposed portions of the second dielectric layer following the plasma ash; and performing a fourth plasma treatment in situ with an activated hydrocarbon species to repair exposed portions of the second dielectric following the second plasma ash.

35. The method of claim 34, wherein the hydrocarbon species comprises at least one of $CH_4$, $C_2H_6$, $C_3H_8$ or a hydrocarbon $C_nH_{2n+2}$ where $n>3$.

36. The method of claim 31, further comprising removing the etch-stop layer at the bottom of the one of the first or second opening, to expose the underlying metal conductor.

37. The method of claim 36, further comprising filling the first and second openings with metal down to the exposed underlying metal conductor.

38. The method of claim 37, wherein filling the first and second openings with metal comprises forming a liner layer over exposed surfaces of the dielectric layer and the exposed underlying metal conductor within the first and second openings; and depositing metal over the liner layer.

39. The method of claim 28, wherein the plasma ash process is a $CO_2$-based plasma ash process; and the plasma treatment process uses $CH_4$ and an inert gas.

* * * * *